United States Patent [19]

Fujii et al.

[11] Patent Number: 5,274,598
[45] Date of Patent: Dec. 28, 1993

[54] SEMICONDUCTOR MEMORY HAVING IMPROVED SENSING ARRANGEMENT

[75] Inventors: Takeo Fujii; Toshio Komuro, both of Tokyo, Japan

[73] Assignee: NEC Corporation, Tokyo, Japan

[21] Appl. No.: 716,480

[22] Filed: Jun. 17, 1991

[30] Foreign Application Priority Data

Jun. 15, 1990 [JP] Japan .................. 2-156676

[51] Int. Cl.[5] .................. G11C 11/40; G11C 7/00
[52] U.S. Cl. ..................... 365/205; 365/207
[58] Field of Search .............. 365/205, 207, 208

[56] References Cited

U.S. PATENT DOCUMENTS 4,085,457 4/1978 Itoh ........................... 365/205
4,748,596 5/1988 Ogura et al. ................ 365/205
4,777,625 10/1988 Sakui et al. ................. 365/207
4,819,207 4/1989 Sakui et al. .............. 365/207 X Primary Examiner—Robert J. Pascal
Assistant Examiner—Seung Ham
Attorney, Agent, or Firm—Sughrue, Mion, Zinn, Macpeak & Seas

[57] ABSTRACT

A semiconductor memory provided with improved sense amplifier-bit line arrangement which is suitable for a high-speed and high-sensitivity read operation. The memory comprises a main bit line pair, a main sense amplifier, a plurality of sub-bit line pairs and a plurality of sub-sense amplifiers in each column. Each of the sub-sense amplifiers includes a pair of output nodes coupled to the main bit line pair and a pair of input nodes coupled to one of the sub-bit line pairs. A pair of switch elements are inserted between the main bit line pair and each one of the sub-bit line pairs for selectively feeding an output of the main sense amplifier back to one of the sub-bit line pair selected.

3 Claims, 8 Drawing Sheets

SEMICONDUCTOR MEMORY HAVING IMPROVED SENSING ARRANGEMENT

FIELD OF THE INVENTION

The present invention relates to a dynamic semiconductor memory, and more particularly to a sense amplifier arrangement thereof.

DESCRIPTION OF THE RELATED ARTS

A typical example of a dynamic random access memory (DRAM) is implemented as shown in FIG. 1. As shown in FIG. 1, two memory cell arrays MA1 and MA2 are arranged in a symmetrical manner with respect to a column decoder 4. Each of the memory cell arrays includes a plurality of dynamic type memory cells MC arranged at intersections of a plurality of pairs of bit lines D, $\overline{D}$ and a plurality of word lines W1L-WnL, W1R-WnR, in a known manner. Row decoders 3L and 3R receive X address data and select one of word lines of the array MA1 and one of word lines of the array MA2, respectively. The column decoder 4 receives Y address data and generates a column selection signal YSW which is used to select one pair of bit lines of the array MA1 to connect them to a pair of bus lines I/OL by enabling one pair of column selection switches SW and one pair of bit lines of the array MA2 to connect them to a pair of bus lines I/OR by enabling a pair of column selection switches SW, respectively.

Assuming that data stored in a memory cell MC1 are to be read out at the time of data read-out, the row decoder 3R activates the word line W1R to which the memory cell MC1 to be selected is connected, in accordance with the X address data from outside. Then, a very small potential change $\Delta V$ occurs on the bit line D which has been charged in advance to a precharge potential $V_0$ such as a potential of about $\frac{1}{2}$ of the power supply potential $V_{cc}$ and this potential change $\Delta V$ is given by the following equation where $C_s$ is the capacitance of the memory cell, $C_D$ is an overall stray capacitance of the bit lines, $V_0$ is the initial potential of the bit lines D, $\overline{D}$, and $V_{so}$ is a write potential of a memory node inside the cell:

$$\Delta V = (V_{so} - V_0)/(1 + C_D/C_s)$$

Generally, the value $\Delta V$ is approximately 100 mV. This very small potential difference in the bit lines is amplified by a sense amplifier SA and the potential of one of the bit lines D, $\overline{D}$ rises towards the power supply potential Vcc with the other dropping towards the ground potential. Thereafter, a corresponding pair of column selection switches SW are driven in accordance with the Y address signal given from outside so as to transfer the signal in the bit line pair D, $\overline{D}$ to the bus lines I/OR. The read signal transferred onto the bus lines I/OR is outputted outside the chip by a buffer circuit (not shown) disposed outside the memory array.

Incidentally, the number of memory cells connected to one of bit lines in FIG. 1 increases with the increase in the memory capacity of the memory chip and the overall stray capacitance $C_D$ of the bit lines described above tends to increase. Hence, the read signal $\Delta V$ of the memory cell tends to decrease. As a result, when the amplification speed of the sense amplifier SA gets belated or when the read signal is below an input offset voltage, an erroneous operation tends to occur. For this reason, the overall stray capacitance $C_D$ of the bit lines must be kept small. One of the methods for accomplishing this object is such one that increases the memory capacity by mounting a plurality of the basic memory cell arrays on the same chip as shown in FIG. 1 without increasing the number of memory cells connected to each bit line in FIG. 1. A second method is such one that memory cell data is first read out on a sub-bit line pair and then transmitted to a main bit line pair in each column.

FIG. 2 is a block diagram of a semiconductor memory that employs the above second method and FIG. 3 is a circuit diagram showing one column arrangement, i.e., one main bit line portion in the semiconductor memory. In FIG. 3, however, only two of a plurality of sub-bit line pairs SBi, $\overline{SBi}$; SBj, $\overline{SBj}$ are representatively shown with the others being omitted. In FIGS. 2 and 3, sense amplifiers 2 are provided for each sub-bit line pair SB, and main sense amplifiers 1 are provided for each column and are connected to main bit line pairs MB, $\overline{MB}$, respectively. Row decoders 3a, 3b are provided for the memory cell array MA1 and row decoders 3c, 3d are provided for the array MA2. Each sub-bit line pair SB, $\overline{SB}$ such as SBi, $\overline{SBi}$ is connected to a pair of main bit lines MB, $\overline{MB}$ through a pair of MOS transistors $Q_T$ which is controlled by corresponding one of sub-bit line selection signals such as SSi, and the pair of main bit lines MB, $\overline{MB}$ are connected to the I/O buses I/OL or I/OR through a pair of MOS transistors $Q_Y$ which are controlled by a column selection signal YSW.

As shown in FIG. 3, the main sense amplifier 1 comprises a differential circuit having a CMOS structure and is activated by main sense amplifier activation signals MSEP and MSEN. Similarly, each of the sub-sense amplifiers 2 is a differential circuit having a CMOS structure and is activated by sub-sense amplifier activation signals such as SSEPi, SSENi. The pair of main bit lines MB, $\overline{MB}$ are pre-charged by a bit line precharge balance circuit 5 which is connected to a $\frac{1}{2}$ Vcc supply line HVC and is controlled by a pre-charge balance signal PDL.

Next, the operation of this circuit will be explained with reference to FIG. 4 which is an operation timing chart of the circuit shown in FIG. 3.

The pre-charge balance signal PDL and the sub-bit line selection signal SSi are at a high level (Vcc) at a time point $t_1$ and the word line selection signal WL is at the low level. The main bit lines and the sub-bit lines are set at the $\frac{1}{2}$ Vcc level of the pre-charge level and the main sense amplifier activation signals MSEP and MSEN and the sub-sense amplifier activation signals SSEPi, SSENi too, are at the $\frac{1}{2}$ Vcc level.

At a time point $t_2$, the pre-charge balance signal PDL and the sub-bit line selection signal such as SSi fall to the low level, the sub-bit lines such as SBi, $\overline{SBi}$ become a floating state. When one of the word lines WL rises to the high level in this state at a time $t_3$, the potential of the sub-bit line SBi fluctuates to some extent in accordance with the data held in the memory cell MC.

At a time $t_4$, the sub-sense amplifier activation signals SSEPi and SSENi start to rise and fall, respectively, the sub-sense amplifier 2 is activated and amplification of the potential difference between the sub-bit line pair starts. After the potential difference between the sub-bit line pair is expanded sufficiently, the sub-bit line selection signal SSi is raised to the high level at a time $t_5$ and the sub-bit line pair SBi, $\overline{SBi}$ and the main bit line pair MB, $\overline{MB}$ are electrically connected. At the same time, the main sense amplifier activation signals MSEP and MSEN are caused to rise and fall, respectively and the main sense amplifier 1 is activated.

PROBLEMS TO BE SOLVED BY THE INVENTION

The two measures for reducing the overall stray capacitance $C_D$ of the bit lines described above involve the following problems. First, in accordance with the method which increases the memory cell arrays in the same chip as shown in FIG. 1, the numbers of row and column decoders, sense amplifiers and I/O buses increases, so that the area of the chip increases. The increase in the area due to the provision of the row and column decoders can be reduced by increasing the wiring layers but the size of the sense amplifiers cannot be reduced by, for example, reducing the number of MOS transistors constituting them, because the sense amplifiers must have complete sense function and complete refresh function.

On the other hand, the example of the conventional main bit/sub-bit line pair structure shown in FIG. 2 can simplify the structure of the sub-sense amplifiers as described in U.S. Pat. No. 4,777,625 issued to Koji Sakui et al, and has an advantage that this structure is suitable for reducing the size. As shown in FIG. 4, however, the sub-bit line pair can be connected to the main bit line pair MB, $\overline{MB}$ only after the signal on the sub-bit line pair SBi, $\overline{SBi}$ is amplified sufficiently. Therefore, this structure involves the problem that the delay of the operation speed is very large because of two stages of amplification.

SUMMARY OF THE INVENTION

It is therefore an object of the present invention to provide a semiconductor memory which can operate at a high-speed.

It is another object of the present invention to provide a semiconductor memory which can be fabricated on the minimum size of a semiconductor chip.

A semiconductor memory in accordance with the present invention has a structure in which a bit line pair to which a plurality of dynamic type memory cells are connected is divided into a plurality of sub-bit line pairs SBl, $\overline{SBl}$, ... SBi, $\overline{SBi}$, ..., SBn, $\overline{SBn}$ and a main bit line pair MB, $\overline{MB}$, is disposed in parallel with the sub-bit line pairs in each column. The main bit line MB is connected to the sub-bit lines SBl, ... SBi, ... SBn through first MIS transistors which are controlled by bit line pair selection signals SSi (i=1−n). Similarly the main bit line $\overline{MB}$ is connected to the sub-bit lines $\overline{SBl}$, ..., $\overline{SBi}$, ... $\overline{SBn}$ through second MIS transistors also controlled by the signals SSi (i=1−n). A third MIS transistor whose gate is connected to the sub-bit line $\overline{SBi}$ is disposed between a sub-sense amplifier activation signal line SSENi (i=1−n) disposed for each sub-bit line pair, and the main bit line MB, and a fourth MIS transistor whose gate is connected to the sub-bit line SBi is disposed between the signal SSENi described above and the main bit line $\overline{MB}$.

BRIEF DESCRIPTION OF THE DRAWINGS

The features and advantages of the semiconductor memory according to the present invention will be more clearly understood from the following description taken in conjunction with the accompanying drawings in which.

DESCRIPTION OF THE PREFERRED EMBODIMENTS

Next, some embodiments of the present invention will be explained with reference to the drawings.

Figure 1:
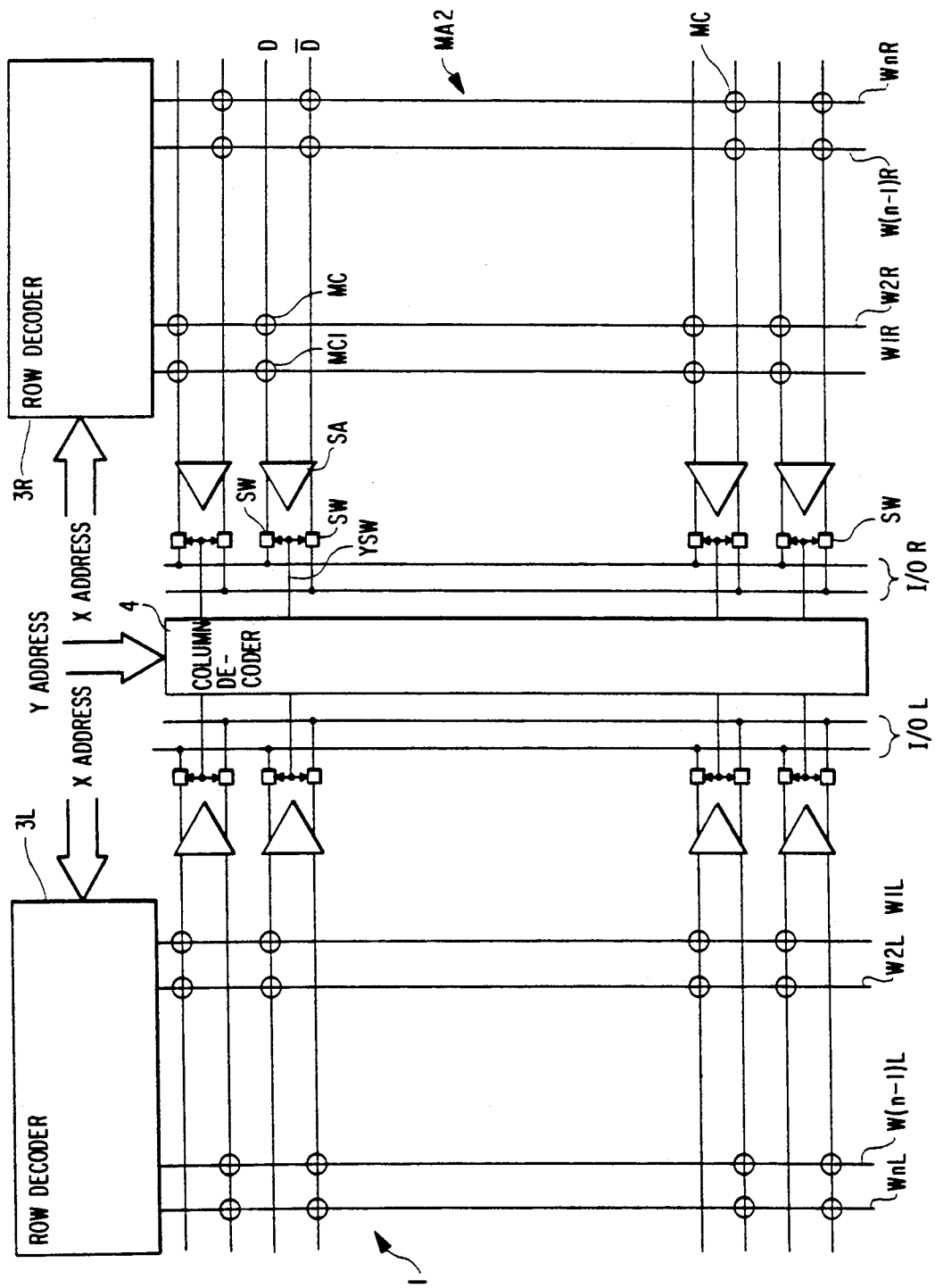
FIG. 1 is one example of a basic layout diagram of a dynamic semiconductor memory in the prior art.
Figure 2:
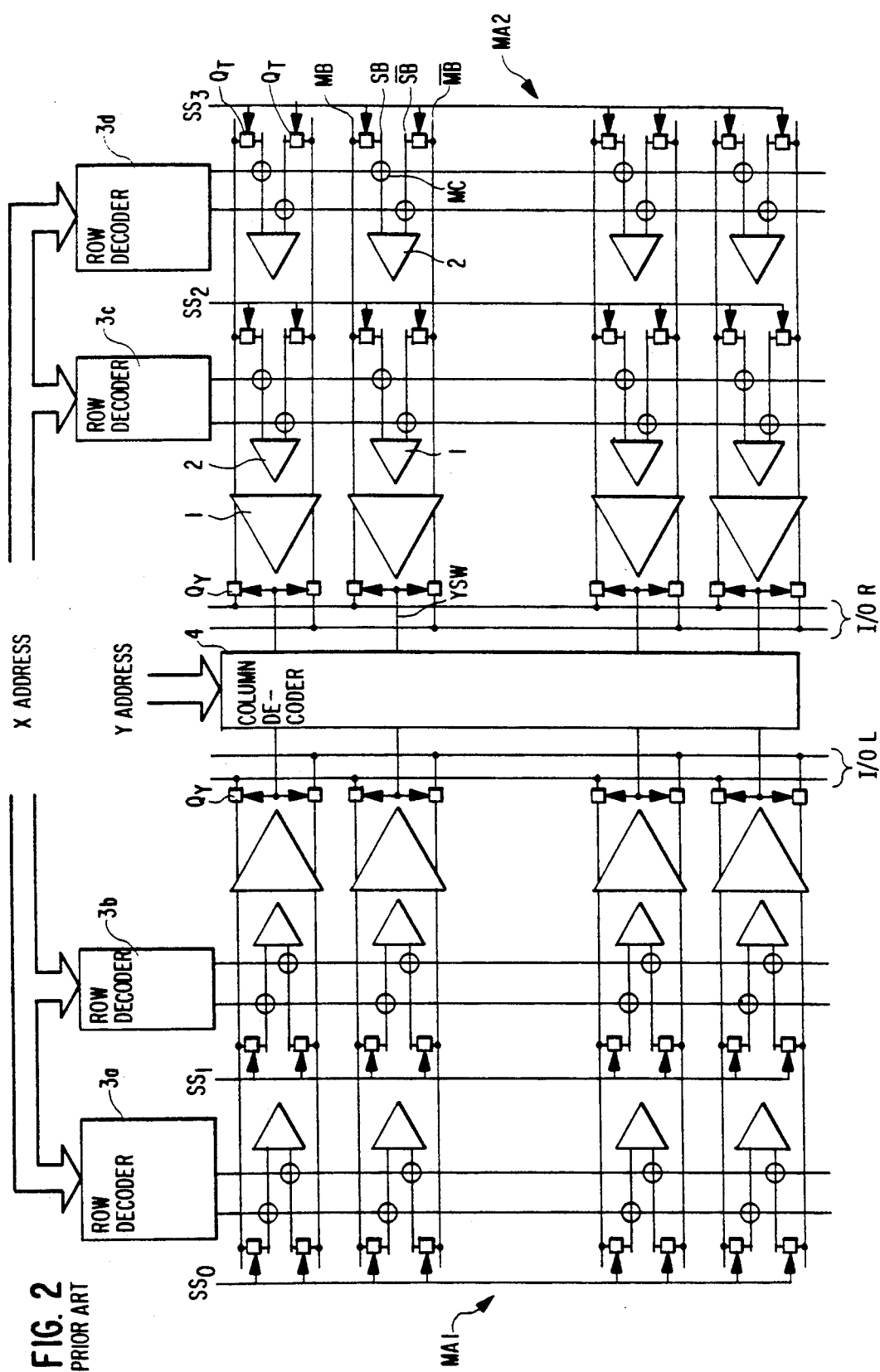
FIG. 2 is another example of a basic layout diagram of a dynamic semiconductor memory in the prior art.
Figure 5:
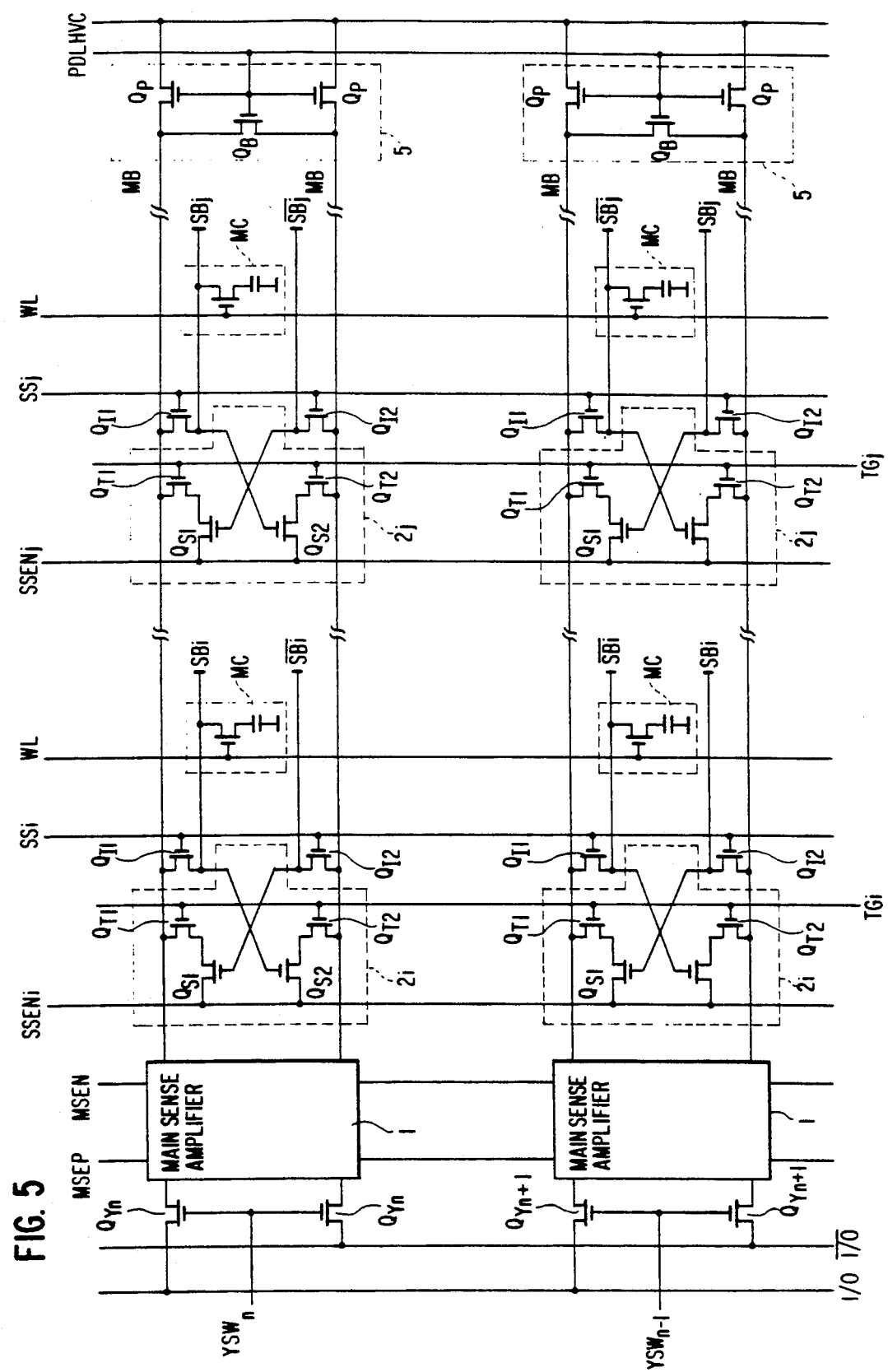
FIG. 5 is a circuit diagram showing a first embodiment of the present invention.
Figure 6:
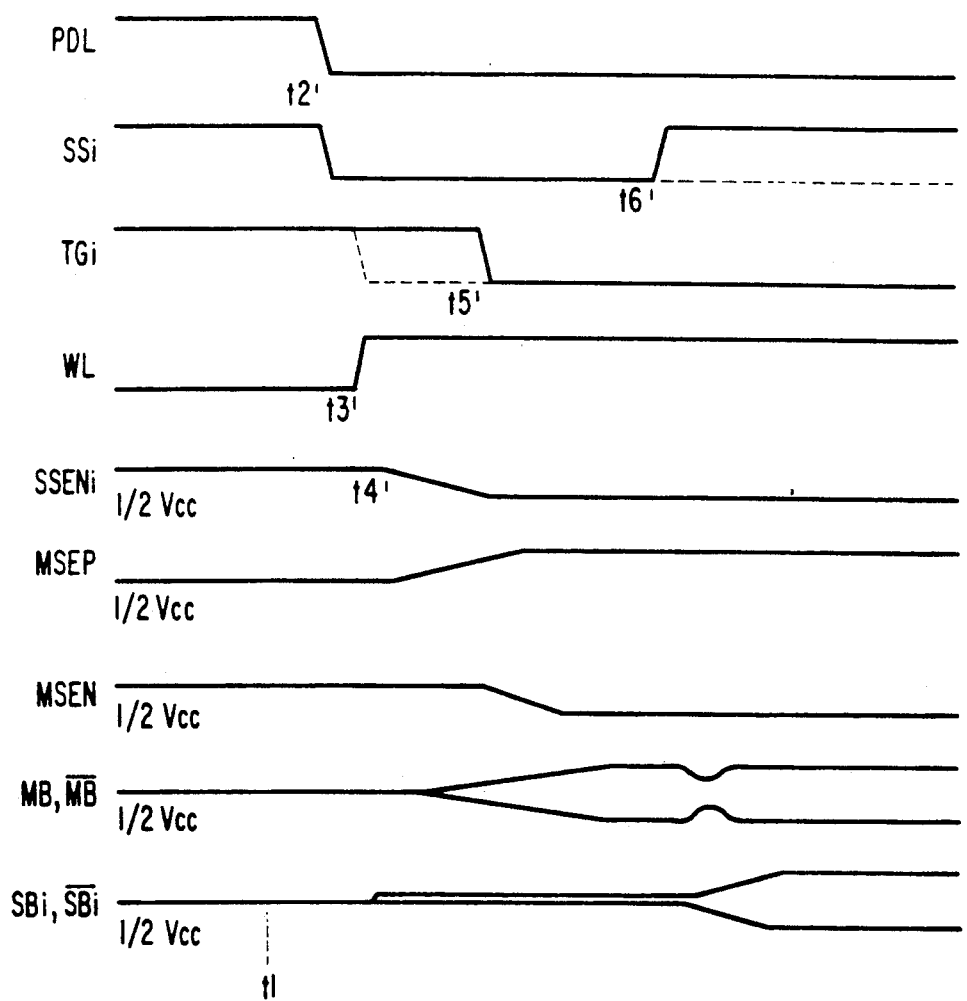
FIG. 6 is an operation waveform diagram of the first embodiment.

FIG. 5 is a circuit diagram showing a first embodiment of the present invention and shows a circuit corresponding to the portion of one of main bit line pairs in the semiconductor memory shown in FIG. 2. FIG. 6 is an operation waveform diagram for explaining the circuit operation of FIG. 5. Incidentally, though only the sub-bit line pairs SBi, $\overline{SBi}$, SBj, $\overline{SBj}$ and only two circuit units associated with these two pairs are shown in FIG. 5, a plurality of units are disposed in practice.

A pre-charge balance circuit 5 which is driven by a pre-charge balance signal PDL and comprises n-channel MOS transistors $Q_P$, $O_B$ is disposed at one of the ends of a main bit line pair MB, $\overline{MB}$, and keeps the main bit line pair and all the sub-bit line pairs at a predetermined pre-charge level during a reset period. Each sub-bit line pair is pre-charged through n-channel MOS transistors $Q_{11}$, $Q_{12}$ that are driven by sub-bit line pair selection signals SSi (i=1−n).

Figure 3:
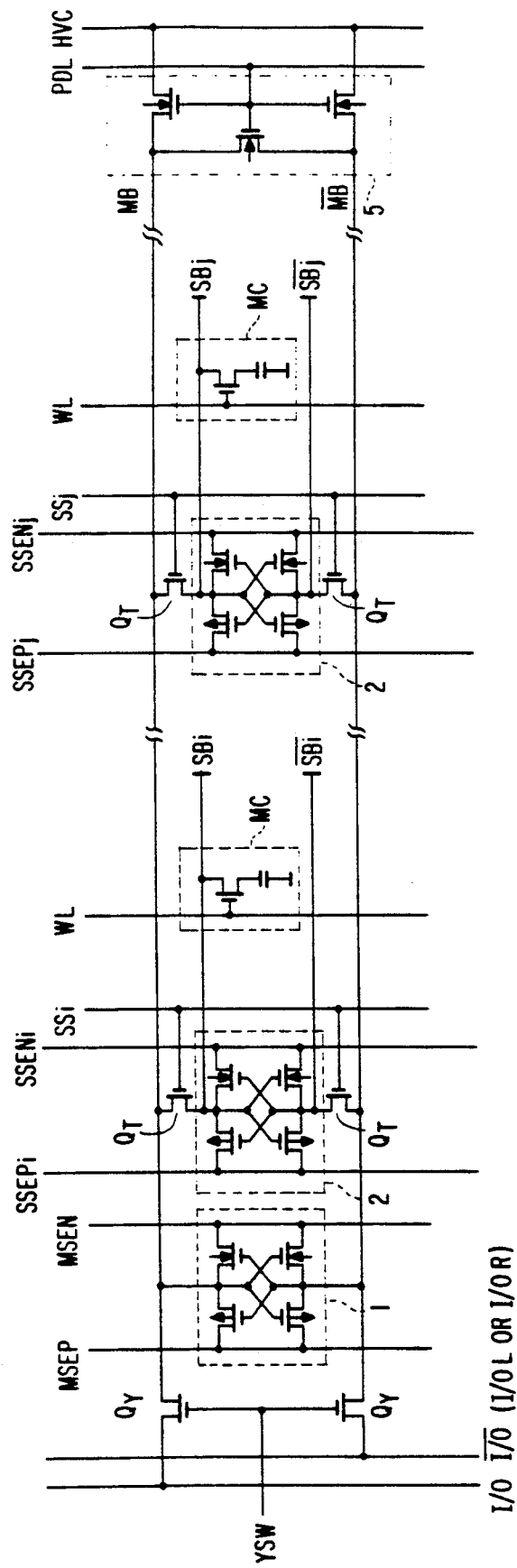
FIG. 3 is a circuit diagram showing a part of the memory of FIG. 2.
Figure 4:
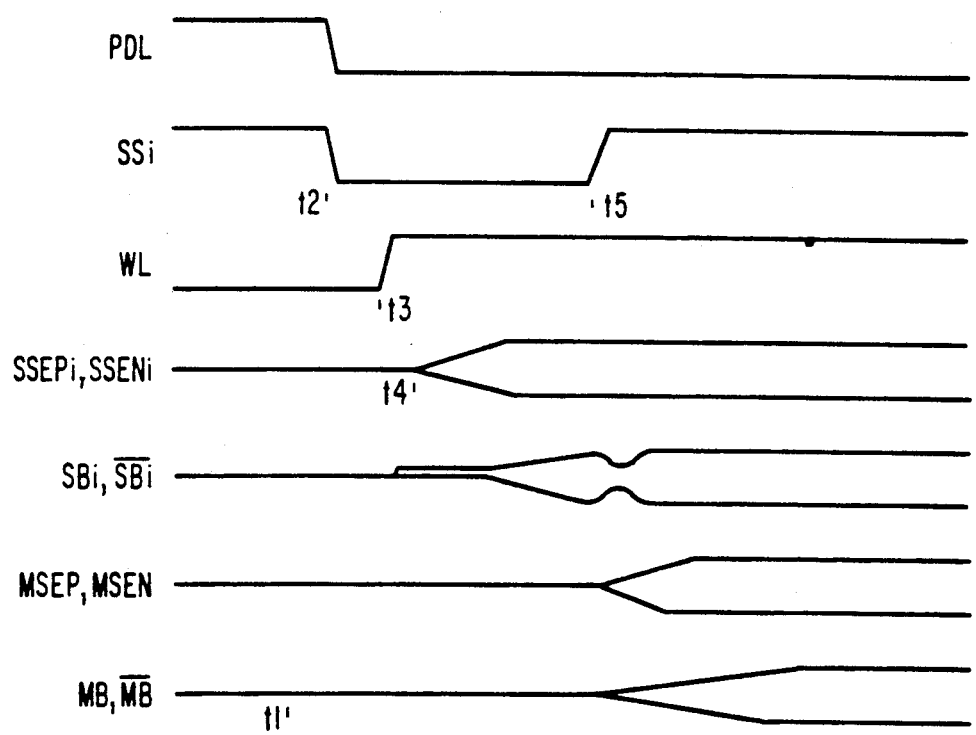
FIG. 4 is an operation waveform diagram of the prior art.

On the other hand, a main sense amplifier 1 is disposed at the other end of the main bit line pair. The structure shown in FIG. 3 may be used as the structure of the main sense amplifier 1 but other circuits having the sense amplifier function can be used, too. Main sense amplifier activation signals MSEP, MSEN for driving the main sense amplifier 1 are kept at a predetermined pre-charge level, that is, at about ½ of a power supply potential Vcc at the time of reset, and rise and fall, respectively, at the time of activation. Main bit line pair MB, $\overline{MB}$ are connected to I/O buses I/O, $\overline{I/O}$ through a pair of n-channel MOS transistors $Q_{Yn}$ which are driven by a column selection signal $YSW_n$.

A sub-sense amplifier 2i which is activated by a sub-sense amplifier activation signal SSENi is connected to each sub-bit line pair SBi, $\overline{SBi}$. The activation signal SSENi is a signal which is kept at a predetermined pre-charge level, that is, at a potential about ½ of the power supply potential, at the time of reset and falls at the time of activation.

A series circuit of an n-channel MOS transistor $Q_{T1}$ which is driven by the sub-sense amplifier selection signal $TG_i$ and an n-channel MOS transistor $Q_{S1}$ whose gate is connected to the sub-bit line $\overline{SBi}$ is interposed between the activation signal line SSENi and the main bit line MB and a series circuit of an n-channel MOS transistor $Q_{T2}$ which is driven by the sub-sense amplifier selection signal TGi, and an n-channel MOS transistor $Q_{S2}$ whose gate is connected to the sub-bit line SBi is interposed between the activation signal line SSENi and the main bit line $\overline{MB}$. The sub-sense amplifier 2i is composed of these four transistors $Q_{T1}$, $Q_{T2}$, $Q_{S1}$ and $Q_{S2}$.

Next, the operation of the circuit of this embodiment will be explained with reference to FIG. 6. In the initial stage, at a time point $t_1$, the MOS transistors $Q_Y$ are cut off to separate I/O buses I/O, $\overline{I/O}$ from the main bit line pair MB, $\overline{MB}$. Since the pre-charge balance signal PDL, the sub-bit line selection signal such as SSi for each sub-bit line and the sub-sense amplifier selection signal TGi are at the high level at this time, the MOS transistors $Q_P$, $Q_B$, $Q_{T1}$, $Q_{T2}$, $Q_{11}$ and $Q_{12}$ are all turned ON and each sub-bit line pair SBi, $\overline{SBi}$ is at the predetermined pre-charge level. All the activation signals SSENi, MSEP and MSEN, too, are at the high level at this time, the MOS transistors $Q_{S1}$, $Q_{S2}$ are cut OFF and the main sense amplifier is in the reset state at this time. The word line WL is in the non-selection state (at the low level) at this time and each memory cell is in the holding state.

At a time point $t_2$ in this state, the pre-charge balance signal PDL falls to the low level, and each sub-bit line selection signal such as SSi falls to the low level, too, and each sub-bit line pair becomes in the floating state. Next, all the sub-sense amplifier selection signals other than the sub-sense amplifier selection signal TGi for the memory cell to be selected fall as indicated by dash line in FIG. 6.

Subsequently, the word line WL to which the memory cell to be selected is connected rises to the high level at a time point $t_3$. At this time, the potential of the sub-bit line SBi fluctuates a little in accordance with the memory data of the selected memory cell. On the other hand, the sub-bit line $\overline{SBi}$ remains at the initial value at this stage but it may be corrected suitably by a method using a dummy cell, or the like, when necessary.

Next, the sub-sense amplifier activation signal SSENi starts falling at a time point $t_4$. In accordance with this drop, the MOS transistor $Q_{S1}$, $Q_{S2}$ are turned ON and the potential of the main bit line pair MB, $\overline{MB}$ starts falling and a potential difference appears on the main bit line pair, too, in accordance with the signal that is read out in the sub-bit line pair. The main sense amplifier activation signals are also activated approximately simultaneously with the generation of the potential difference and in this case, it is possible to cause only the p-channel side of the main sense amplifier, in other words, only the activation signal MSEP, to rise first. This structure can prevent the potential of one of the main bit line pair prevent the potential of one of the main bit line pair MB, $\overline{MB}$ from falling more then necessarily. When the main sense amplifier 1 is activated by the activation signals MSEP, MSEN, expansion of the difference potential on the main bit line pair is promoted.

The sub-sense amplifier selection signal TGi is caused to fall at the timing at which the difference potential on the main bit line reaches a predetermined value such as 200 mV–500 mV so as to cut off the MOS transistors $Q_{T1}$, $Q_{T2}$ at a time point $t_5$. This operation is necessary for cutting off a penetration current flowing between the activation signals MSEP–SSENi when the activation signal MSEP is caused to rise. (The MOS transistors $Q_{S1}$, $Q_{S2}$ are so set as to be turned ON at the sub-bit line potential near the pre-charge level.)

When the selection signal TGi falls, the activation signal MSEN of the main sense amplifier, too, starts falling, so that one of the main bit line pair continues to rise towards the power supply potential and the other continues to fall towards the ground potential.

Thereafter, the sub-bit line selection signal SSi with which the selected memory cell concerns is raised at the time $t_6$ and charge/discharge of the sub-bit line pair is effected through the main bit line pair. Re-write of the memory cell is thus executed.

If the overall stray capacitance of the main bit line pair is greater than the overall stray capacitance of the sub-bit line pairs in the operation of the embodiment at a time point $t_5$ described above, the penetration current can be checked by raising the sub-bit line selection signal SSi at this time $t_5$ so as to lower the potential of one of the sub-bit line pair instead of lowering the sub-sense amplifier selection signal TGi.

Figure 7:
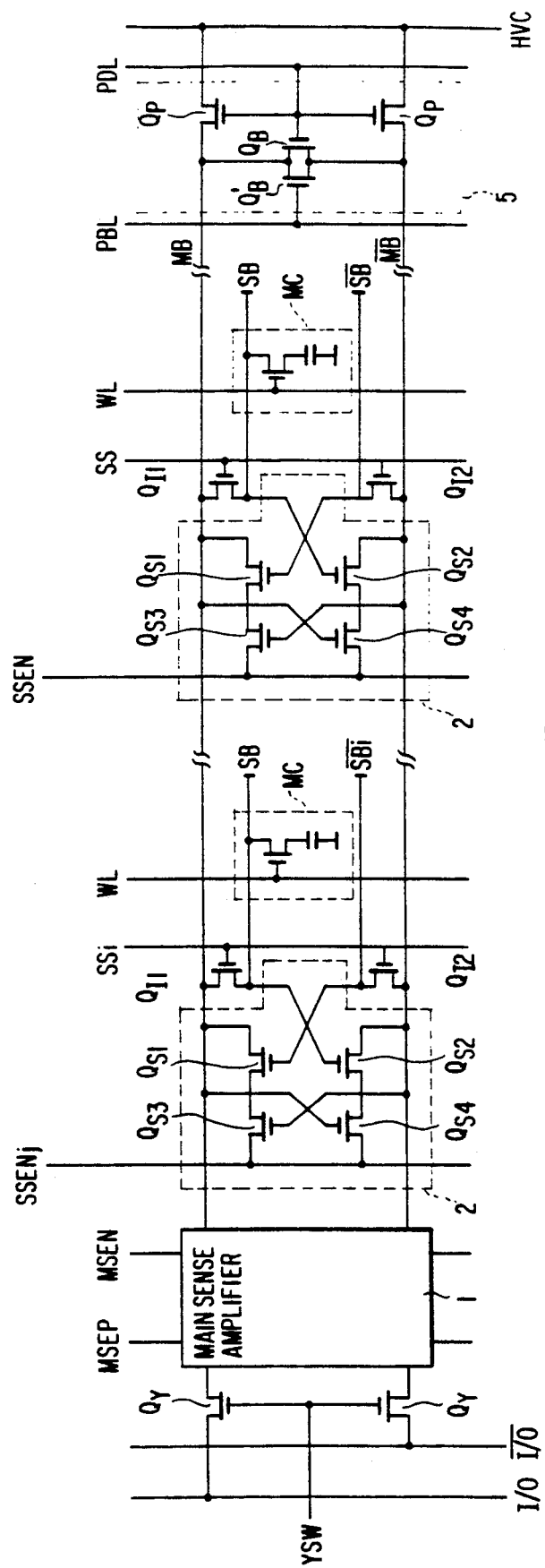
FIG. 7 is a circuit diagram showing a second embodiment of the present invention.
Figure 8:
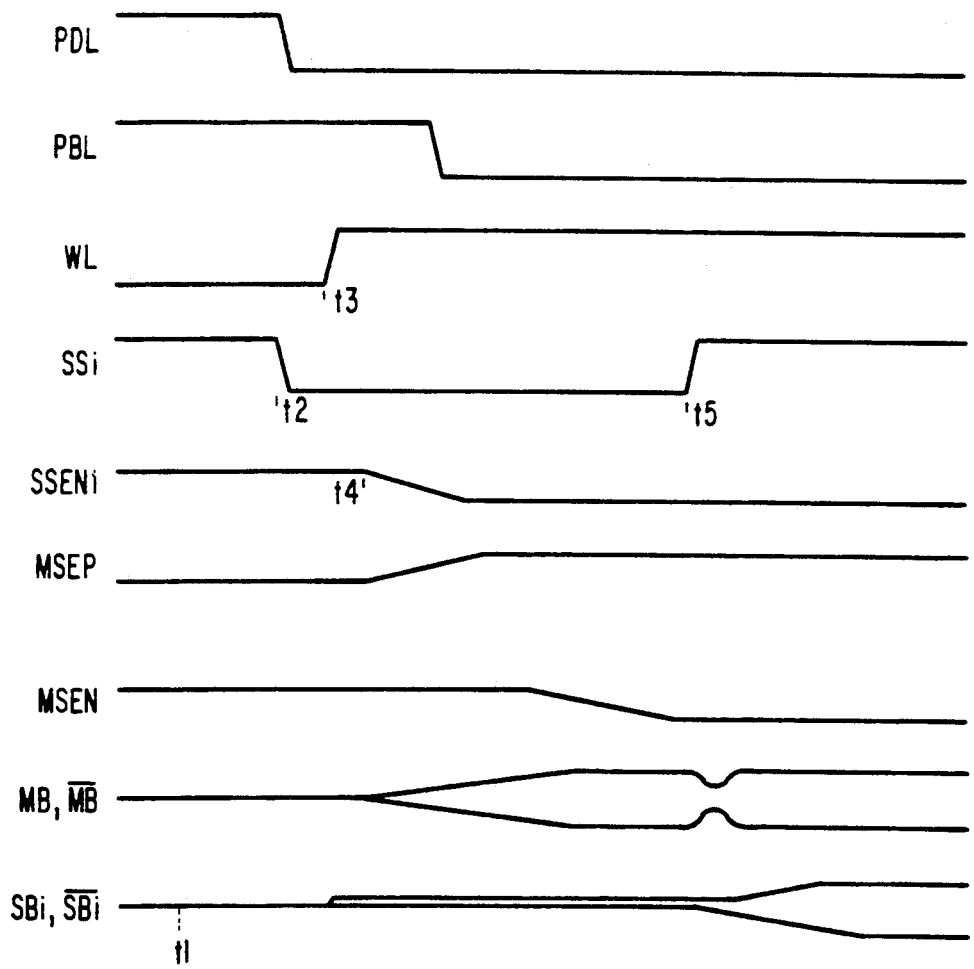
FIG. 8 is an operation waveform diagram of the second embodiment.

FIG. 7 is a circuit diagram showing the second embodiment of the present invention. In the drawing, like reference numeral is used to identify like parts and signals in FIG. 5. FIG. 8 is an operation waveform diagram of the second embodiment. The difference of the second embodiment from the first embodiment is that MOS transistors $Q_{S3}$ and $Q_{S4}$, whose gates are connected to the main bit line pair MB, $\overline{MB}$, respectively, are connected in place of the MOS transistors $Q_{T1}$ and $Q_{T2}$ which are controlled by the sub-sense amplifier selection signal TGi.

The operation will be explained. Each signal is exactly the same as that of the first embodiment in the initial state at a time point $t_1$. The pre-charge balance signal PDL and the sub-bit line selection signal SSi fall at a time point $t_2$, the selected word line WL then rises at a time point $t_3$, and the data of the memory cell is read out in the sub-bit line SBi. Next, the sub-sense amplifier activation signal SSENi starts falling at a time point $t_4$, the MOS transistors $Q_{S1}$, $Q_{S2}$ and $Q_{S3}$, $Q_{S4}$ are turned ON and the potential of the main bit line pair MB, $\overline{MB}$ start falling, too. However, the difference potential becomes greater in accordance with the data on the sub-bit line pair. At this time, the main bit line, for example, the bit line MB, having a lower potential cuts off the MOS transistor $Q_{S4}$ connected to the gate, and prevents unnecessary drop of the main bit line $\overline{MB}$ as well as the penetration current. The main sense amplifier activation signal MSEP is raised at about time point $t_4$ so as to speed up the amplification of the signal in the main bit line pair MB, $\overline{MB}$ and to subsequently lower the activation signal MSEN. The sub-bit line selection signal SSi is raised at a time point $t_5$ at which the difference potential in the main bit line reaches a predetermined value, thereby executing re-write of the memory cell in the same way as in the first embodiment.

In this embodiment, the MOS transistor $Q_B$ which is driven by the balance signal PBL is added to the pre-charge balance circuit 5 and this transistor is used in order to eliminate the difference potential and to stabilize the operation when the difference potential generates for some reason in the main bit line pair at the time point $t_4$ and causes an unstable operation. The balance signal PBL falls after the activation of the sense amplifier.

EFFECT OF THE INVENTION

As explained above, the present invention constitutes the sub-sense amplifier by use of only one kind of MOS transistors and transmits the difference potential of the sub-bit line pair to the main bit lines by the MOS transistors of the sub-sense amplifier connected between the sub-sense amplifier activation signal line and the main bit line. Therefore, the present invention can produce the following effects.

(1) Since the time for amplifying the data on the sub-bit line pair by the sub-sense amplifier is not necessary, the operation speed can be improved.

(2) Since the sub-sense amplifier can be made compact, large scale of integration of the semiconductor memory becomes possible. Since the number of divisions by the sub-bit lines can be increased without increasing the chip area in comparison with the conventional device, stable operation becomes possible even with a smaller cell capacity and margin for variations generated in production process can be improved, too.

What is claimed is:

1. A semiconductor memory comprising:

a plurality of memory cells arranged in rows and columns, a plurality of pairs of main bit lines, each pair being arranged in a respective one of the columns, a plurality of main sense amplifiers respectively provided for each of the columns and coupled to each of said pairs of main bit lines, a plurality of pairs of sub-bit lines respectively provided for each of the columns, each of said memory cells being coupled to an associated one of said sub-bit lines, a plurality of sub-sense amplifiers respectively provided for each of said pairs of sub-bit lines, each of said sub-sense amplifiers having a pair of input nodes coupled to an associated one of said pairs of said sub-bit lines and a pair of output nodes coupled to an associated one of said pairs of main bit lines, each of said sub-sense amplifiers further having a first series circuit of first and second field effect transistors coupled between a control node and one of the associated pairs of main bit lines and a second series circuit of third and fourth field effect transistors coupled between said control node and the other of said associated pairs of main bit lines, gates of said first and third transistors being coupled to the pair of input nodes thereof and said second and fourth transistors being rendered conductive at least when an associated sub-sense amplifier is selected, a plurality of pairs of switch elements each coupled between each of said pairs of sub-bit lines and an associated one of said pairs of main bit lines, first control means coupled to the control nodes of said sub-sense amplifiers for selectively enabling one of said sub-sense amplifiers in each of the columns, second control means coupled to said main sense amplifiers for operatively enabling said main sense amplifiers after said sub-sense amplifiers are selectively enabled, and third control means coupled to said plurality of pairs of switch elements for rendering one pair of switch elements associated with the selected sub-sense amplifier conductive.

2. The semiconductor memory according to claim 1, in which gates of said second and fourth transistors are supplied with a first control signal which is activated when the associated sub-sense amplifier is selected.

3. The semiconductor memory according to claim 1, in which gates of said second and fourth transistors are coupled to a respective associated one of said main bit lines within each of said pairs of said main bit lines.

* * * * *